(12) United States Patent
Ku et al.

(10) Patent No.: US 11,971,276 B2
(45) Date of Patent: Apr. 30, 2024

(54) CAMERA DEVICE

(71) Applicant: LG INNOTEK CO., LTD., Seoul (KR)

(72) Inventors: Bon Seok Ku, Seoul (KR); Chang Yeon Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 229 days.

(21) Appl. No.: 17/616,337

(22) PCT Filed: Jun. 2, 2020

(86) PCT No.: PCT/KR2020/007142
§ 371 (c)(1),
(2) Date: Dec. 3, 2021

(87) PCT Pub. No.: WO2020/251205
PCT Pub. Date: Dec. 17, 2020

(65) Prior Publication Data
US 2022/0326047 A1    Oct. 13, 2022

(30) Foreign Application Priority Data

Jun. 13, 2019 (KR) .................. 10-2019-0070300

(51) Int. Cl.
*G01B 7/14* (2006.01)
*G01D 5/14* (2006.01)
(Continued)

(52) U.S. Cl.
CPC .............. *G01D 5/145* (2013.01); *G03B 5/04* (2013.01); *G03B 13/36* (2013.01);
(Continued)

(58) Field of Classification Search
CPC .... H10N 52/00; H10N 52/80; H02K 41/0354; H02K 41/0356; H02K 11/215;
(Continued)

(56) References Cited

U.S. PATENT DOCUMENTS 6,008,552 A    12/1999  Yagoto et al.
10,802,376 B2 * 10/2020  Sugawara ................ G02B 7/09
(Continued)

FOREIGN PATENT DOCUMENTS

CN    103176331 A    6/2013
CN    107561820 A    1/2018
(Continued)

OTHER PUBLICATIONS

Baek et al., "Development of OIS actuator for Mobile Phone Camera," Journal of Information Storage System Society, vol. 5, 2009, pp. 8-13, with an English abstract.

*Primary Examiner* — Thang X Le
(74) *Attorney, Agent, or Firm* — Birch, Stewart, Kolasch & Birch, LLP

(57) ABSTRACT

A camera device according to the present embodiment comprises: a first operation part comprising one of a first coil or a magnet and arranged on a fixed member; a second operation part which comprises the other one of the first coil and the magnet, is arranged on a movable member, and faces the first operation part; a hall sensor facing one of the first operation part and the second operation part; and a second coil arranged near the hall sensor, wherein at least a portion of the second coil is arranged between the hall sensor and the first coil.

20 Claims, 7 Drawing Sheets

(51) Int. Cl.
  *G03B 5/04* (2021.01)
  *G03B 13/36* (2021.01)
  *H02K 41/035* (2006.01)
  *H10N 52/00* (2023.01)
  *H10N 52/80* (2023.01)

(52) U.S. Cl.
  CPC ......... *H02K 41/0354* (2013.01); *H10N 52/00* (2023.02); *H10N 52/80* (2023.02); *G03B 2205/0015* (2013.01); *G03B 2205/0069* (2013.01)

(58) Field of Classification Search
  CPC ........ H04N 23/00; H04N 23/60; G03B 13/36; G03B 3/10; G03B 5/04; G03B 2205/0007; G03B 2205/0015; G03B 2205/0069; G01D 5/145
  See application file for complete search history.

(56) References Cited

U.S. PATENT DOCUMENTS

| | | |
|---|---|---|
| 2013/0200883 A1 | 8/2013 | Mehnert et al. |
| 2013/0300401 A1 | 11/2013 | Krapf et al. |
| 2016/0202494 A1* | 7/2016 | Seo ........................ G03B 29/00 359/557 |
| 2016/0216529 A1* | 7/2016 | Park ..................... H04N 23/687 |
| 2019/0121103 A1 | 4/2019 | Bachar et al. |
| 2019/0208128 A1* | 7/2019 | Park ....................... H04N 23/55 |
| 2021/0018819 A1* | 1/2021 | Min ........................ G03B 3/10 |
| 2021/0021801 A1* | 1/2021 | Lee ....................... G02B 13/001 |

FOREIGN PATENT DOCUMENTS

| | | |
|---|---|---|
| CN | 108375863 A | 8/2018 |
| KR | 10-2018-0037879 A | 4/2018 |
| KR | 10-2018-0076165 A | 7/2018 |
| KR | 10-1892853 B1 | 8/2018 |
| WO | WO 2017/150774 A1 | 9/2017 |

\* cited by examiner

CAMERA DEVICE

CROSS REFERENCE TO RELATED APPLICATIONS

This application is the National Phase of PCT International Application No, PCT/KR2020/007142, filed on Jun. 2, 2020, which claims priority under 35 U.S.C, 119(a) to Patent Application No. 10-2019-0070300, filed in the Republic of Korea on Jun. 13, 2019, all of which are hereby expressly incorporated by reference into the present application.

TECHNICAL FIELD

The present invention relates to a camera device.

BACKGROUND ART

The content described below provides background information on the present embodiment and does not describe the prior art.

As the spread of various portable terminals is widely generalized and wireless Internet services are commercialized, the demands of consumers related to portable terminals are also diversifying, so that various types of additional devices are being installed in the portable terminals.

Among them, there is a camera module for photographing a subject as a photograph or a moving picture. Meanwhile, an autofocus function for automatically adjusting a focus according to a distance of a subject is applied to a recent camera module. In addition, a hand shake correction function that prevents the image from being shaken due to hand shake of the photographer is applied.

Meanwhile, a voice coil motor (VCM) is used to apply an autofocus function or hand shake correction function. Voice coil motors use electromagnetic interaction between magnets and coils. At this time, the movement of the magnet is sensed through the Hall sensor.

However, there is a problem in that the measurement sensitivity of the Hall sensor is lowered due to the effect on the coil.

DETAILED DESCRIPTION OF THE INVENTION

Technical Subject

An object of the present invention is to provide a camera device capable of improving the measurement sensitivity of a Hall sensor.

Technical Solution

A camera device according to an aspect of the present invention for achieving the above object comprises: a first driving unit comprising one of a first coil or a magnet and disposed on a fixed member; a second driving unit comprising the other one of the first coil and the magnet, being disposed on a movable member, and facing the first driving unit; a Hall sensor facing one of the first driving unit and the second driving unit; and a second coil disposed at the periphery of the Hall sensor, wherein at least a portion of the second coil is disposed between the Hall sensor and the first coil.

A camera device according to an aspect of the present invention for achieving the above object comprises: a first driving unit comprising one of a first coil or a magnet and disposed on a fixed member; a second driving unit comprising the other one of the first coil or the magnet, disposed on the movable member, and facing the first driving unit; a Hall sensor facing one of the first driving unit and the second driving unit; and a second coil disposed on one of the fixed member or the movable member, wherein the second coil is disposed to be overlapped with a central region of the first coil in a first direction perpendicular to the optical axis, and wherein at least a portion of the Hall sensor is disposed to be overlapped with a central region of the second coil in the first direction.

A camera device according to an aspect of the present invention for achieving the above object comprises: a first coil disposed on a fixed member; a magnet disposed on the movable member and facing the first coil; a Hall sensor facing the magnet; and a second coil disposed on the fixed member, wherein the second coil is disposed adjacent to the Hall sensor, and wherein the direction of the magnetic field generated by the second coil is opposite to the direction of the magnetic field generated by the first coil.

In addition, the direction of the current flowing through the second coil may be opposite to the direction of the current flowing through the first coil.

In addition, winding directions of the first coil and the second coil may be opposite to each other.

In addition, the size of the second coil may be smaller than the size of the first coil.

In addition, the second coil may be disposed inside the first coil, and the Hall sensor may be disposed inside the first coil.

In addition, the first coil may comprise a first opening formed in a central region, and the second coil may be disposed in the first opening.

In addition, the second coil may comprise a second opening formed in a central region, and the Hall sensor may be disposed at a center of the second opening.

In addition, the thickness of the second coil may be thinner than the thickness of the first coil.

In addition, the fixed member may comprise a substrate.

In addition, the substrate may comprise a flexible substrate.

In addition, the second coil may comprise a fine pattern coil (FP coil).

Advantageous Effects

Through the present embodiment, it is possible to provide a lens module and a camera device in which the measurement sensitivity of a Hall sensor is enhanced.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (comprising technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may comprise the plural form unless specifically stated in the phrase, and when described as "at least one (or more than one) of A and B and C", it may comprise one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when described as being formed or arranged in "on (above)" or "below (under)" of each component, "on (above)" or "below (under)" means that it comprises not only the case where the two components are directly in contact with, but also the case where one or more other components are formed or arranged between the two components. In addition, when expressed as "on (above)" or "below (under)", the meaning of not only an upward direction but also a downward direction based on one component may be comprised.

Hereinafter, the present invention will be described in more detail with reference to the accompanying drawings.

Figure 1:
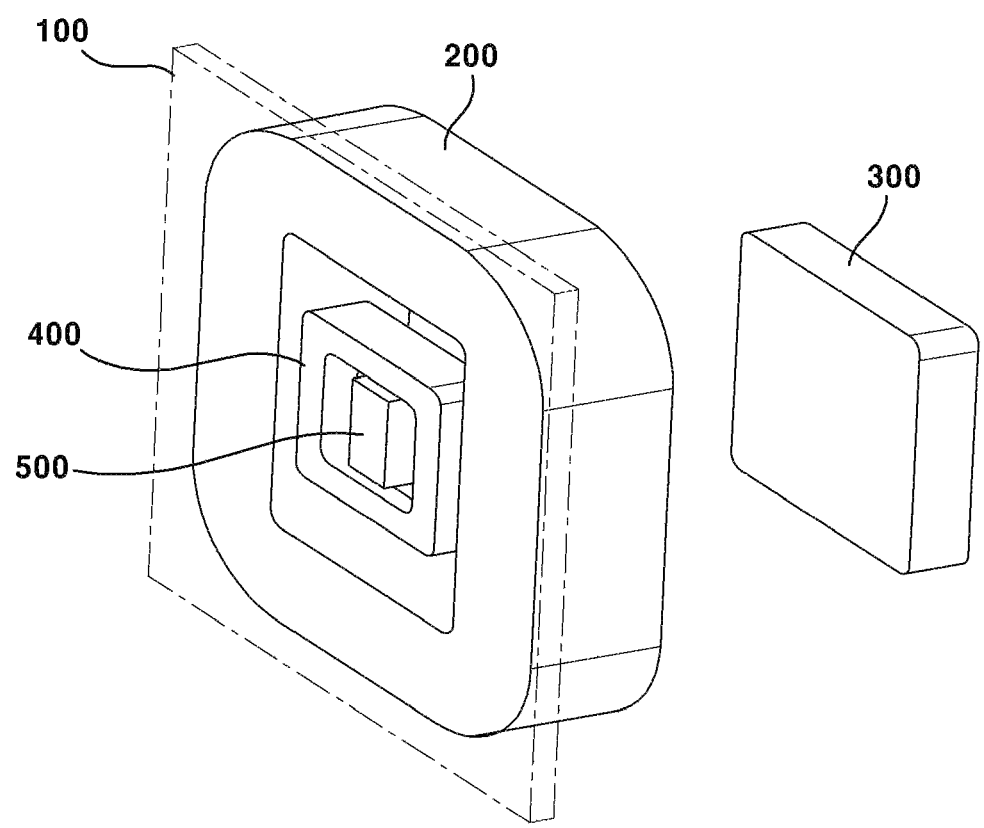
FIG. 1 is a perspective view of a camera device according to an embodiment of the present invention.
Figure 2:
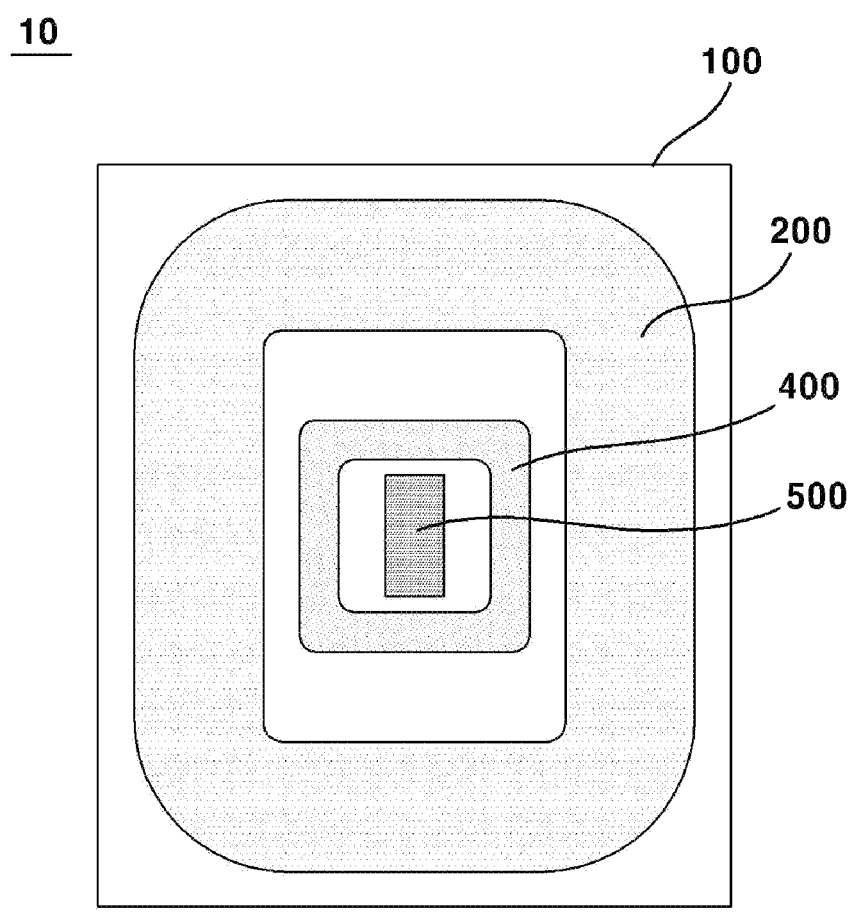
FIG. 2 is a plan view of a camera device according to an embodiment of the present invention.
Figure 3:
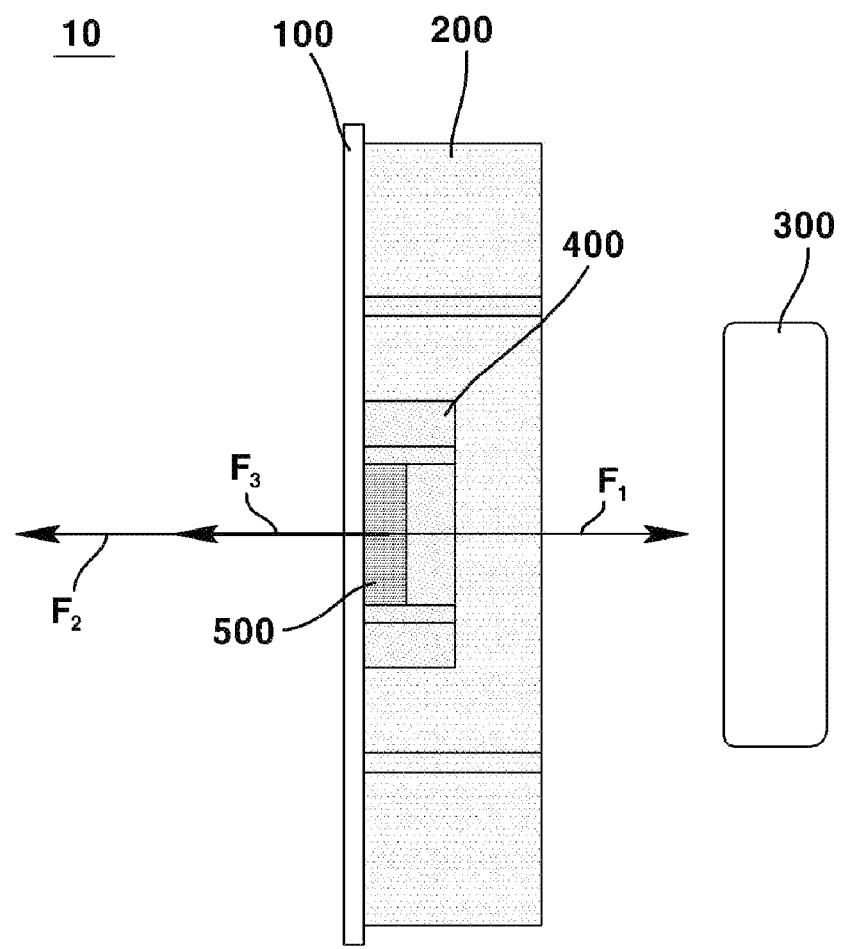
FIG. 3 is a cross-sectional view of a camera device according to an embodiment of the present invention.

FIG. 1 is a perspective view of a camera device according to an embodiment of the present invention. FIG. 2 is a plan view of a camera device according to an embodiment of the present invention. FIG. 3 is a cross-sectional view of a camera device according to an embodiment of the present invention.

Referring to FIGS. 1 to 3, the camera device 10 according to an embodiment of the present invention may comprise a fixed member, a movable member (not shown), a first driving unit, a second driving unit, a second coil 400, and a Hall sensor 500, but may be implemented except for some of these configurations, and does not exclude additional configurations.

The first driving unit may be disposed in a fixed member. The second driving unit is disposed on the movable member, and may face the first driving unit. The Hall sensor 500 may face one of the first driving unit and the second driving unit. The second coil 400 may be disposed at the periphery of the Hall sensor 500. Here, the fixed member may comprise a substrate 100. One of the first driving unit and the second driving unit may be a first coil 200, and the other may be a magnet 300. The movable member can move with respect to the fixed member through the electromagnetic interaction of the first driving unit and the second driving unit. Through this, an autofocus function or an image stabilization function may be performed.

The camera device 10 may comprise a substrate 100. In one embodiment of the present invention, the substrate 100 is described as a fixed member as an example, but is not limited thereto, and the substrate 100 may be a movable member. A first coil 200, a second coil 400, and a Hall sensor 500 may be disposed on the substrate 100. A first coil 200, a second coil 400, and a Hall sensor 500 may be disposed on a surface of the substrate 100 facing the magnet 300. The substrate 100 may be a printed circuit board (PCB). The substrate 100 may be a rigid printed circuit board (RPCB). The substrate 100 may be a flexible substrate. The substrate 100 may be a flexible printed circuit board (FPCB). The substrate 100 may be electrically connected to the first coil 200, the second coil 400, and the Hall sensor 500. The substrate 100 may supply power to the first coil 200, the second coil 400, and the Hall sensor 500. A control unit (not shown) for supplying power to the first coil 200 and the second coil 400 may be disposed on the substrate 100. A control unit for transmitting and receiving signals from the Hall sensor 500 may be disposed on the substrate 100.

The camera device 10 may comprise a first coil 200. The first coil 200 may be disposed on the substrate 100. The first coil 200 may be disposed on a surface of the substrate 100 opposite to the magnet 300. The first coil 200 may face the magnet 300. The first coil 200 may be formed in a rectangular strip shape. The first coil 200 may be formed in a ring shape.

The first coil 200 may comprise a first hollow formed in the central region. The second coil 400 and the Hall sensor 500 may be disposed in the first hollow of the first coil 200. A Hall sensor 500 may be disposed in a central region the first hollow of the first coil 200. The first coil 200 may be overlapped with the second coil 400 in a first direction. The central region of the first coil 200 may be overlapped with the second coil 400 in a first direction. Here, the first direction may be a direction perpendicular to the optical axis. For example, the first direction may be a direction perpendicular to a second direction facing the first coil 200 and the magnet 300. In addition, the central region of the first coil 200 may mean a first hollow of the first coil 200 or may mean a smaller region than the first hollow. The length or thickness of the first coil 200 in the second direction may be greater than the length or thickness of the second coil 400 in the second direction. A length of the first coil 200 in the second direction may be greater than a length of the Hall sensor 500 in the second direction. For example, as shown in FIG. 3, the first coil 200 may be protruded further in the magnet 300 direction than the second coil 400 and the Hall sensor 500.

The first coil 200 may move the movable member on which the magnet 300 is disposed through electromagnetic interaction with the magnet 300. If the substrate 100 is a movable member, the first coil 200 can be moved through electromagnetic interaction with the magnet 300.

The camera device 10 may comprise a magnet 300. The magnet 300 may be disposed on a movable member (not shown). In an embodiment of the present invention, the magnet 300 is described as being disposed on a movable member as an example, but is not limited thereto, and the magnet 300 may be disposed on a fixed member. The magnet 300 may face the first coil 200. The magnet 300 may face the second coil 400. The magnet 300 may face the Hall sensor 500.

The magnet 300 may be moved through electromagnetic interaction with the first coil 200. If the magnet 300 is disposed on the fixed member, the magnet 300 may move the movable member on which the first coil 200 is disposed through electromagnetic interaction with the first coil 200.

In an embodiment of the present invention, the magnet 300 is described as being formed in a rectangular shape as an example, but is not limited thereto, the shape of the magnet 300 may be variously changed.

The camera device 10 may comprise a second coil 400. The second coil 400 may be disposed on the substrate 100. The second coil 400 may be disposed on a surface of the substrate 100 facing the magnet 300. The second coil 400 may face the magnet 300. The second coil 400 may be disposed in the first coil 200. The second coil 400 may be disposed in the first hollow of the first coil 200. The second coil 400 may be formed in a rectangular strip shape. The second coil 400 may be formed in a ring shape. The second coil 400 may be disposed between the first coil 200 and the Hall sensor 500. At least a portion of the second coil 400 may be disposed between the first coil 200 and the Hall sensor 500. The second coil 400 may be disposed at the periphery of the Hall sensor 500. The second coil 400 may comprise a second hollow. A Hall sensor 500 may be disposed in the second hollow of the second coil 400. A Hall sensor 500 may be disposed in a central region of the second hollow of the second coil 400. The second coil 400 may be disposed adjacent to the Hall sensor 500. A central region of the second coil 400 may be overlapped with at least a portion of the Hall sensor 500 in a first direction.

The direction of the magnetic field of the second coil 400 may face the opposite direction of the magnetic field of the first coil 200. For example, the winding direction of the second coil 400 may be opposite to the winding direction of the first coil 200. Unlike this, the current direction of the second coil 400 may be opposite to the current direction of the first coil 100. Referring to FIG. 3, the first magnetic force F1 of the first coil 200 is directed toward the magnet 300, and the second magnetic force F2 of the magnet 300 is directed toward the first coil 200. At this time, the second coil 400 is disposed between the first coil 200 and the Hall sensor 500 so that the third magnetic force F3 of the second coil 400 is directed in the opposite direction of the magnet 300. That is, the direction of the third magnetic force F3 of the second coil 400 may be opposite to the direction of the first magnetic force F1 of the first coil 200. Through this, since the third magnetic force F3 of the second coil 400 cancels the first magnetic force F1 of the first coil 200, the sensitivity of the second magnetic force F2 of the magnet 300 detected by the Hall sensor 500 can be increased.

The length or thickness of the second coil 400 in the second direction, for example, toward the magnet 300 may be smaller than the length or thickness of the first coil 200 in the second direction. A length of the second coil 400 in the second direction may be greater than a length of the Hall sensor 500 in the second direction. Through this, the sensitivity of the second magnetic force F2 of the magnet 300 detected by the Hall sensor 500 can be increased in a line that does not interfere with the electromagnetic interaction between the first coil 200 and the magnet 300.

The camera device 10 may comprise a Hall sensor 500. The Hall sensor 500 may be disposed on the substrate 100. The Hall sensor 500 may be disposed on a surface of the substrate 100 facing the magnet 300. The hall sensor 500 may face the magnet 300. The hall sensor 500 may detect the position of the magnet 300.

The Hall sensor 500 may be disposed on the first coil 200. The Hall sensor 500 may be disposed inside the first coil 200. The Hall sensor 500 may be disposed in a central region of the first coil 200. The Hall sensor 500 may be disposed on the second coil 400. The Hall sensor 500 may be disposed inside the second coil 400. At least a portion of the Hall sensor 500 may be overlapped with a central region of the second coil 400 in the first direction. The Hall sensor 500 may be disposed adjacent to the second coil 400. The Hall sensor 500 may be disposed in a central region of the second coil 400. The Hall sensor 500 may be disposed in a second hollow of the second coil 400. The Hall sensor 500 may be disposed in a center area of the second hollow of the second coil 400. Here, the central region of the second coil 400 may be the second hollow, and the central region of the second coil 400 may be smaller than the second hollow.

According to the camera device 10 according to an embodiment of the present invention, it is possible to enhance the measurement sensitivity of the magnet 300 by reducing noise of the Hall sensor 500 without a separate additional circuit configuration.

Figure 4:
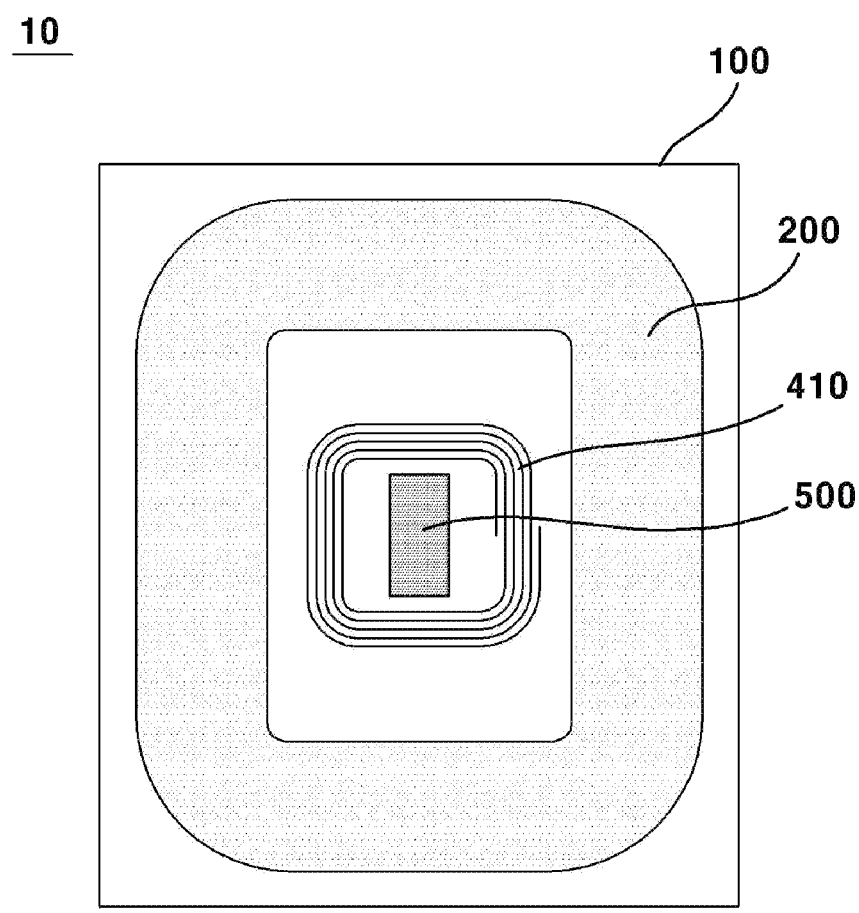
FIG. 4 is a plan view of a camera device according to another embodiment of the present invention.
Figure 5:
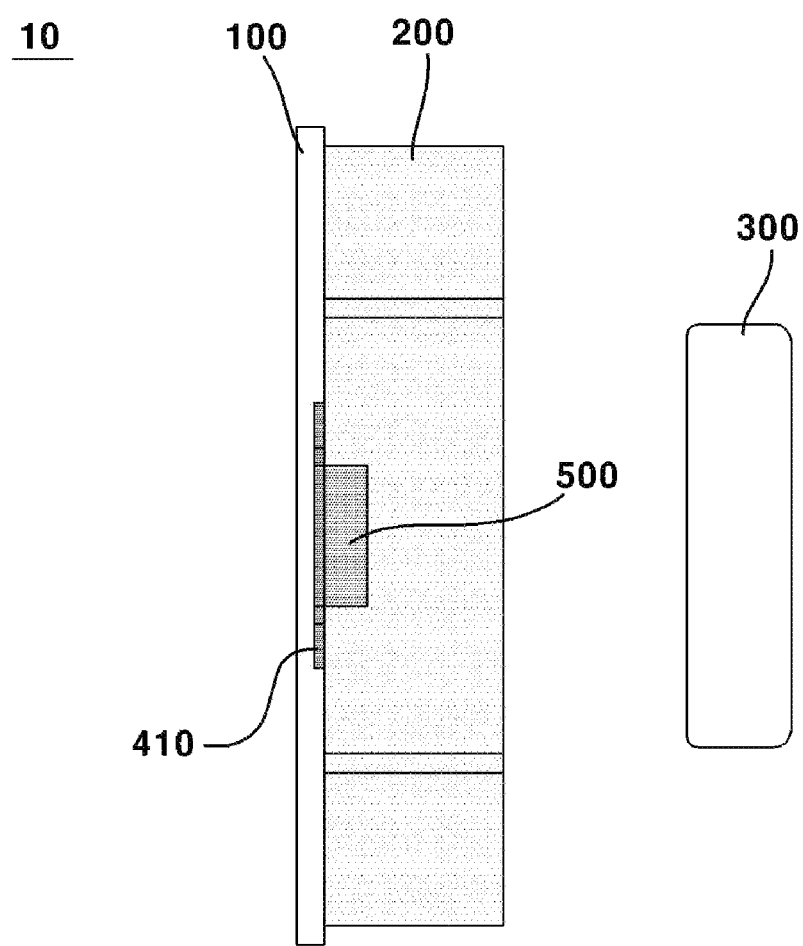
FIG. 5 is a cross-sectional view of a camera device according to another embodiment of the present invention.

FIG. 4 is a plan view of a camera device according to another embodiment of the present invention. FIG. 5 is a cross-sectional view of a camera device according to another embodiment of the present invention. In the camera device 10 according to another embodiment of the present invention, components having the same reference numerals as the camera device 10 according to an embodiment of the present invention may be understood as the same configuration. Hereinafter, differences from the camera device 10 according to an embodiment of the present invention among the camera device 10 according to another embodiment of the present invention will be described.

The camera device 10 according to another embodiment of the present invention may comprise a second coil 410. The second coil 410 may be disposed on the substrate 100. The second coil 410 may be mounted on a surface of the substrate 100 facing the magnet 300. The second coil 410 may be a pattern coil (P coil). The second coil 410 may be a fine pattern coil (FP coil) integrally formed with the substrate 100.

According to the camera device 10 according to another embodiment of the present invention, since the second coil 410 is formed of a patterned coil, there is an advantage in that the manufacturing cost can be reduced.

Figure 6:
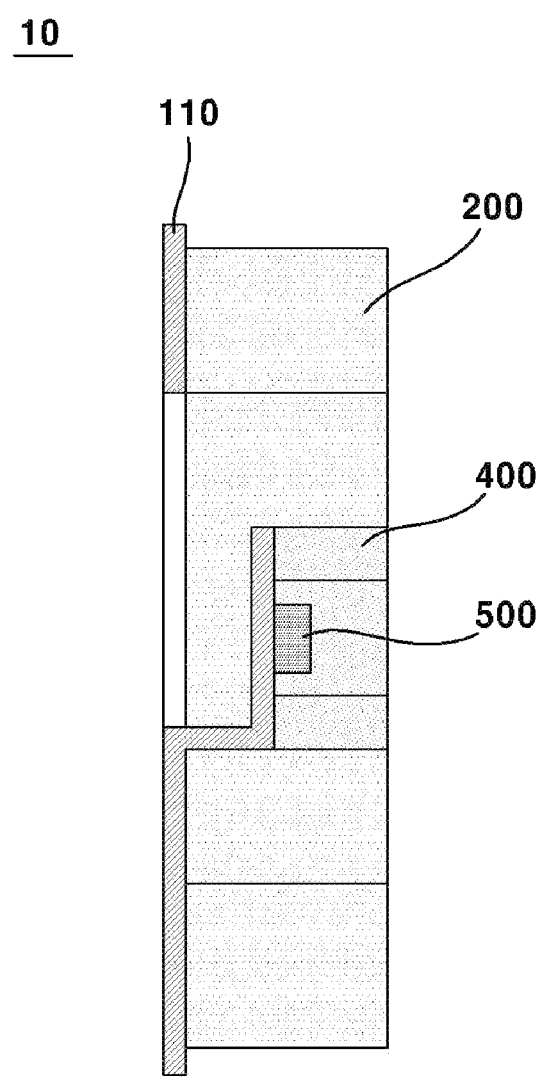
FIG. 6 is a cross-sectional view of a camera device according to yet another embodiment of the present invention.

FIG. 6 is a cross-sectional view of a camera device according to yet another embodiment of the present invention. In the camera device 10 according to yet another embodiment of the present invention, components having the same reference numerals as the camera device 10 according to an embodiment of the present invention may be understood as the same configuration. Hereinafter, differences from the camera device 10 according to an embodiment of the present invention among the camera device 10 according to yet another embodiment of the present invention will be described.

The camera device 10 may comprise a substrate 110. The substrate 110 may be a printed circuit board (PCB). The substrate 110 may be a rigid printed circuit board (RPCB). The substrate 110 may be a flexible substrate. The substrate 110 may be a flexible printed circuit board (FPCB).

At least a portion of the substrate 110 may be bent. The substrate 100 may comprise a first region in which the first coil 200 is seated, and a second region in which the second coil 400 and the Hall sensor 500 are seated. The second region may be formed in a central region of the first region. The second region may be bent in the first region and disposed closer to the magnet 300 side. The second region may be cut off in the first region, bent twice, and disposed parallel to the first region.

At this time, a surface of the second coil 400 facing the magnet 300 may be disposed on the same plane as a surface facing the magnet 300 of the first coil 200.

According to the camera device 10 according to yet another embodiment of the present invention, since the Hall sensor 500 is closer to the magnet 300, there is an advantage that the measurement sensitivity of the Hall sensor 500 can be further enhanced.

Figure 7:
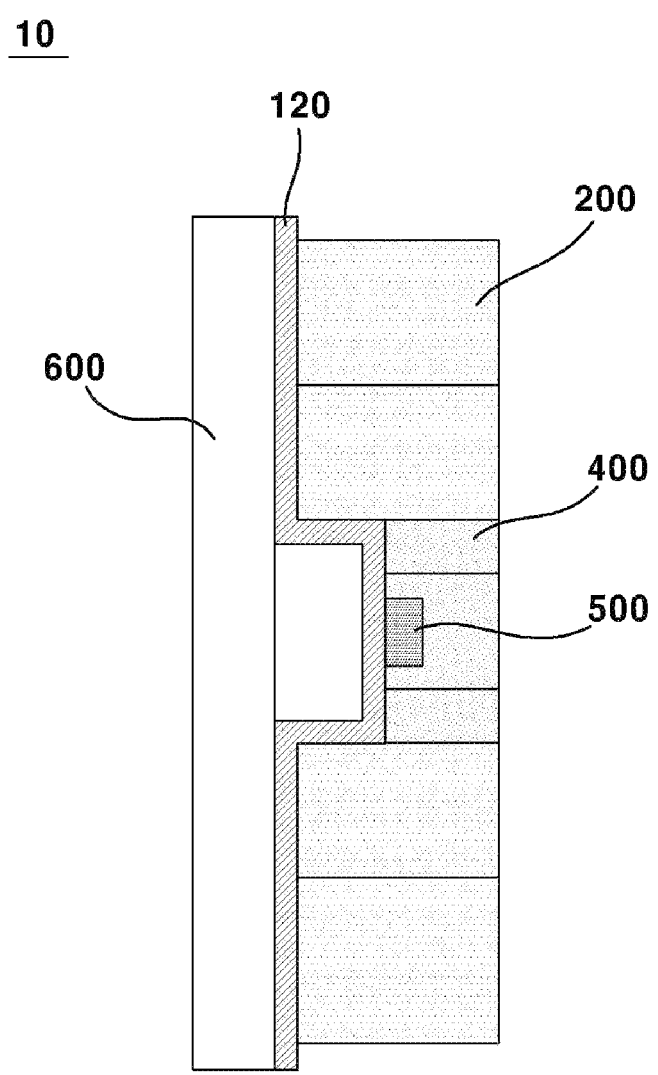
FIG. 7 is a cross-sectional view of a camera device according to yet another embodiment of the present invention.

FIG. 7 is a cross-sectional view of a camera device according to yet another embodiment of the present invention. In the camera device 10 according to yet another embodiment of the present invention, components having the same reference numerals as the camera device 10 according to an embodiment of the present invention may be understood as the same configuration. Hereinafter, differences from the camera device 10 according to an embodiment of the present invention among the camera device 10 according to yet another embodiment of the present invention will be described.

The camera device 10 may comprise a substrate 120. The substrate 120 may be a printed circuit board (PCB). The substrate 120 may be a rigid printed circuit board (RPCB). The substrate 120 may be a flexible substrate. The substrate 120 may be a flexible printed circuit board (FPCB).

The substrate 100 may comprise a first region in which the first coil 200 is seated, and a second region in which the second coil 400 and the Hall sensor 500 are seated. The second region may be formed in a central region of the first region. The second region may be bent in the first region and disposed closer to the magnet 300 side. The second region may be disposed parallel to the first region.

The camera device 10 may comprise a spacer 600. The spacer 600 may be disposed on the other side of the substrate 120. The spacer 600 may comprise a third region overlapping the first coil 200 in a second direction and a fourth region overlapping the second coil 400 in a second direction. The fourth region of the spacer 600 may be protruded further toward the magnet 300 than the third region.

At this time, a surface of the second coil 400 facing the magnet 300 may be disposed on the same plane as a surface facing the magnet 300 of the first coil 200.

According to the camera device 10 according to yet another embodiment of the present invention, since the Hall sensor 500 is closer to the magnet 300, there is an advantage that the measurement sensitivity of the Hall sensor 500 can be further enhanced.

The embodiments of the present invention have been described above with reference to the accompanying drawings, but a person skilled in the art to which the present invention belongs may understand that the present invention can be implemented in other specific forms without changing the technical spirit or essential features. Therefore, it should be understood that the embodiments described above are illustrative and non-limiting in all respects.

The invention claimed is:

1. A camera device comprising:
   a first driving unit comprising one of a first coil and a magnet and disposed on a fixed member;
   a second driving unit comprising the other one of the first coil and the magnet, disposed on a movable member, and facing the first driving unit;
   a Hall sensor facing one of the first driving unit and the second driving unit; and
   a second coil disposed around the Hall sensor,
   wherein at least a portion of the second coil is disposed between the Hall sensor and the first coil.

2. The camera device of claim 1, wherein a direction of a current flowing through the second coil is opposite to a direction of a current flowing through the first coil.

3. The camera device of claim 1, wherein a winding direction of the first coil and a winding direction of the second coil are opposite to each other.

4. The camera device of claim 1, wherein a size of the second coil is smaller than a size of the first coil.

5. The camera device of claim 1, wherein the second coil is disposed in the first coil, and
   wherein the Hall sensor is disposed in the first coil.

6. The camera device of claim 5, wherein the first coil comprises a first opening formed in a central region, and
   wherein the second coil is disposed in the first opening.

7. The camera device of claim 6, wherein the second coil comprises a second opening formed in a central region, and
   wherein the Hall sensor is disposed at a center of the second opening.

8. The camera device of claim 1, wherein a thickness of the second coil is thinner than a thickness of the first coil.

9. The camera device of claim 1, wherein the second coil is spaced apart from the Hall sensor and the first coil.

10. The camera device of claim 1, wherein the fixed member comprises a substrate, and
    wherein the first coil, the second coil and the Hall sensor are disposed on the substrate.

11. The camera device of claim 10, wherein the substrate comprises a flexible substrate, and
    wherein the second coil comprises a pattern coil formed on the flexible substrate.

12. The camera device of claim 10, wherein the substrate comprises a first area disposed with the first coil and a second area disposed with the second coil and the Hall sensor, and
    wherein a distance between the second area and the magnet is shorter than a distance between the first area and the magnet.

13. The camera device of claim 1, wherein the second coil is overlapped with the first coil and the Hall sensor in a first direction.

14. The camera device of claim 13, wherein, in the first direction, a length of the first coil is greater than a length of the magnet.

15. The camera device of claim 13, wherein, in a direction perpendicular to the first direction, a thickness of the second coil is greater than a thickness of the Hall sensor.

16. A portable terminal comprising the camera device of claim 1.

17. A camera device comprising:
a substrate;
a movable member spaced apart from the substrate;
a first coil disposed on the substrate;
a magnet disposed on the movable member and facing the coil;
a second coil disposed on the substrate;
a Hall sensor disposed on the substrate,
wherein the second coil is disposed in the first coil, and
wherein the Hall sensor is disposed in the second coil.

18. The camera device of claim 17, wherein the second coil is disposed between the Hall sensor and the first coil, and wherein the second coil is spaced apart from the Hall sensor and the first coil.

19. The camera device of claim 17, wherein a size of the second coil is smaller than a size of the first coil.

20. The camera device of claim 17, wherein a direction of a magnetic field generated by the second coil is opposite to a direction of a magnetic field generated by the first coil.

* * * * *